United States Patent [19]

Carroll

[11] Patent Number: 4,857,893
[45] Date of Patent: Aug. 15, 1989

[54] SINGLE CHIP TRANSPONDER DEVICE

[75] Inventor: Gary T. Carroll, Boulder, Colo.

[73] Assignee: Bi Inc., Boulder, Colo.

[21] Appl. No.: 153,237

[22] Filed: Feb. 8, 1988

Related U.S. Application Data

[63] Continuation-in-part of Ser. No. 888,246, Jul. 18, 1986.

[51] Int. Cl.[4] .............................................. G08B 13/14
[52] U.S. Cl. .................................. 340/572; 340/825.54
[58] Field of Search ................... 340/572, 825.54, 539, 340/571; 342/44, 51

[56] References Cited

U.S. PATENT DOCUMENTS

| | | | |
|---|---|---|---|
| 3,465,724 | 9/1969 | Broadbent | 340/572 |
| 4,242,671 | 12/1980 | Plows | 340/572 |
| 4,260,983 | 4/1981 | Falck et al. | 340/572 |
| 4,333,072 | 6/1982 | Beigel | 340/825.54 |
| 4,463,353 | 7/1984 | Kuzara | 340/825.54 |
| 4,573,042 | 2/1986 | Boyd et al. | 340/539 |
| 4,630,044 | 12/1986 | Polzer | 340/825.54 |
| 4,646,090 | 2/1987 | Mawhinney | 340/572 |
| 4,656,463 | 4/1987 | Anders et al. | 340/572 |
| 4,724,427 | 2/1988 | Carroll | 340/572 |

OTHER PUBLICATIONS

Saleh et al., "Permalloy Thin-Film Inductors", Electronics Letters, vol. 6, No. 26, pp. 850-852, (Dec. 31, 1970).
Soohoo, "Magnetic Thin Film Inductors for Integrated Circuit Applications", IEEE Trans. on Magnetics, vol. Mag-15, No. 6, (Nov. 1979).

Primary Examiner—Joseph A. Orsino
Assistant Examiner—Jill D. Jackson
Attorney, Agent, or Firm—Fitch, Even, Tabin & Flannery

[57] ABSTRACT

A transponder device receives a carrier signal from an interrogator unit. This carrier signal, of frequeny F, is rectified by a rectifying circuit in order to generate operating power. Logic/timing circuits derive a clock signal and second carrier signal of frequency F/n from the received carrier signal. This clock signal reads a unique identifying data word from a programmable read only memory (PROM). The data word is encoded and mixed with the carrier signal in a balanced modulator circuit. The output of the balanced modulator is transmitted to the interrogator unit where it is decoded and used as an identifying signal. The identifying signal identifies the particular transponder device from which it originated. The rectifier and balanced modulator circuits are realized from the same diode elements. All electrical circuits of the transponder device are realized on the same monolithic semiconductor chip. In one embodiment, an antenna receiving/transmitting coil is also part of the chip, being placed around the periphery thereof. In alternative embodiments, various hybrid elements may be connected to the monolithic elements in order to realize additional functions, such as adjustable tuning of the receiving circuit, independent crystal frequency control, and battery-powered operation.

14 Claims, 10 Drawing Sheets

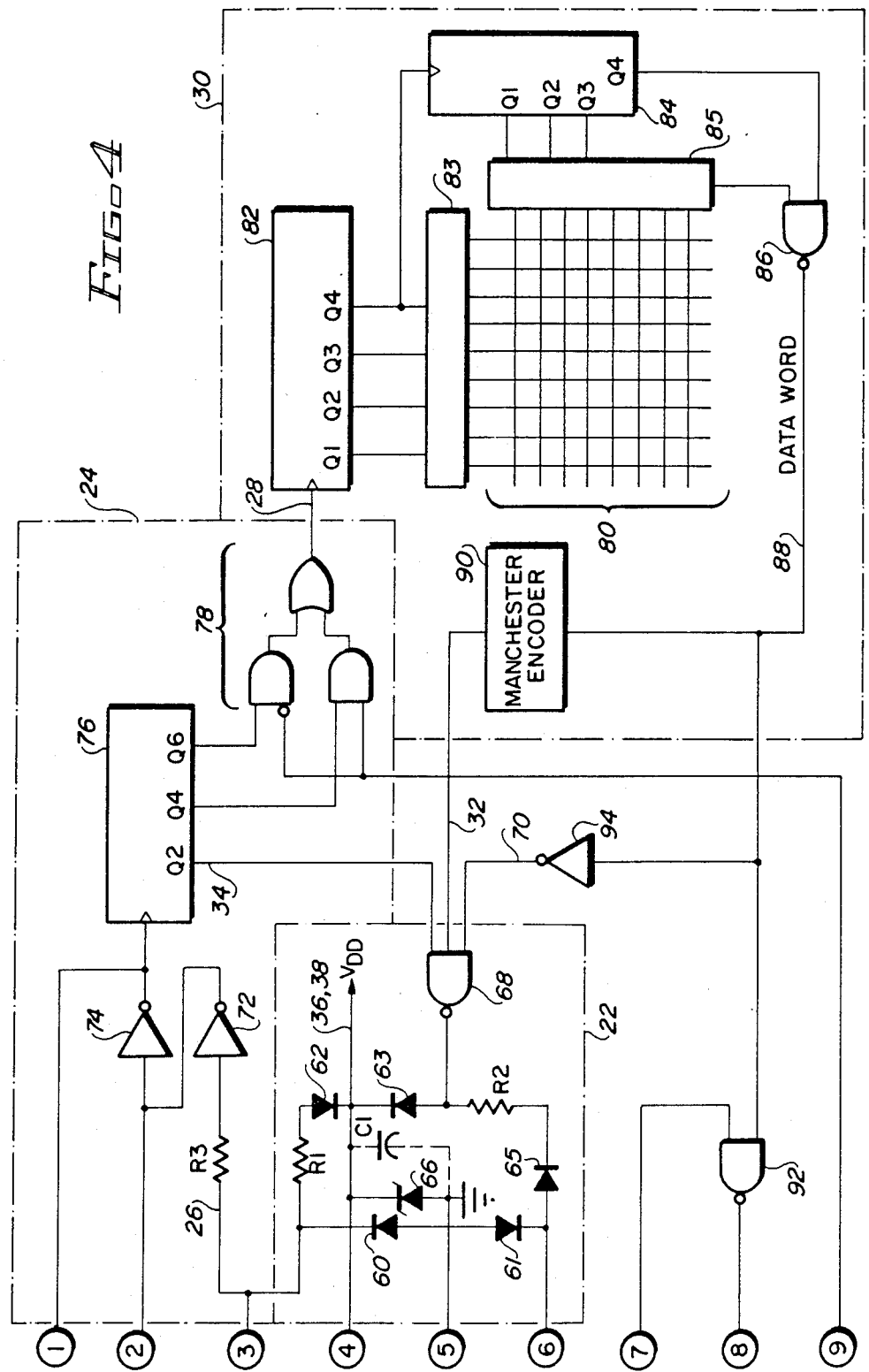

SINGLE CHIP TRANSPONDER DEVICE

This is a continuation-in-part of copending application Ser. No. 888,246, filed on July 18, 1986.

This invention relates to electronic identification devices and systems, and more particularly to an electronic identification transponder device that is realized with miniaturized circuits built or fabricated on a single monolithic semiconductor chip. This invention also relates to the manner of processing signals within such a transponder device.

BACKGROUND OF THE INVENTION

Electronic identification systems known in the art are generally one of two types: (1) tuned/detuned systems; and (2) transponder systems.

Tuned/Detuned Identification Systems

Tuned/detuned systems are tuned circuits that are selectively detuned by an identification element. (Alternatively, detuned circuits may selectively be tuned by the identification element.) Such systems use a controller/interrogator that sets up some form of magnetic field. This field, when in close proximity to an identification element interacts with the identification element in such a way that the identification element can be identified. For example, in the absence of the identification element, the electromagnetic field created by the interrogator/controller exists in a tuned condition or state. However, as soon as the identification element is brought into close proximity to the field, it interacts with the field in a way to detune it. The manner and degree of detuning can then be measured and used to identify the particular identification element employed. By affixing unique identification elements (those which will interact with the field in a unique way) to a plurality of objects to be identified, such objects can be electronically identified whenever they are brought within the field of the controller/interrogator by simply monitoring the manner and degree of detuning that results. Advantageously, such identification elements may be totally passive, requiring no external or internal power for operation. Thus, they can be realized in a relatively small space. As such, they are especially well suited for use in small, lightweight, inexpensive identification tags that can be placed on the objects to be identified. U.S. Pat. Nos. 3,465,724 and 3,516,575 are examples of such a tuned/detuned electronic identification system.

It is significant to note that the identification element used in such tuned/detuned identification systems does not receive, process, generate, nor transmit any electronic signals. Rather, the identification element merely interacts with the magnetic field created by the interrogator/controller. This interaction can be thought of as a form of magnetic modulation that allows an identification to be made once the field is demodulated.

Because the identification element only interacts with the magnetic field created by the controller/interrogator, and is not required to receive and process any electronic signals transmitted by the interrogator/controller, and is not required to generate and transmit any responsive signals back to the interrogator/controller, the identification element of a tuned/detuned identification system may be realized very inexpensively and compactly. Unfortunately, however, because there are only a limited number of ways that the magnetic field from the interrogator/controller can be modified or modulated, and because the identification element must typically be in very close proximity to the interrogator/controller in order to measurably interact with the magnetic field, such tuned/detuned identification systems are limited in their use. Such systems will typically only be used in applications involving a relatively small number of elements or types of elements that are to be identified. Further, the elements to be identified must be movable to the extent that they can be brought in close proximity to the interrogator/controller.

Transponder Type Identification Systems

A second type of electronic identification system known in the art is the transponder or transceiver system. Such systems employ a transponder or transceiver identification element that is affixed to the objects to be identified. (It is noted that "objects", for purposes of this application and as used hereinafter when referring to items, things, persons, or animals being identified by an identification element of the prior art or the present invention, refers to any thing or item that needs identifying, and includes stationary, movable, inanimate, or animate objects.) This transponder or transceiver element receives an interrogation signal transmitted from a controller/interrogator unit. For purposes of this application, a transponder or transceiver element is any device that receives an incoming interrogation signal and responds thereto by generating and transmitting an outgoing responsive signal. The outgoing responsive signal, in turn, is modulated or otherwise encoded so as to uniquely identify or label the particular object to which the transponder element is affixed.

Because the amount of information that may be contained in the outgoing responsive signal is typically limited only by the type of encoding used, and because modern encoding techniques allow a large amount of information to be included therein, such transponder or transceiver electronic identification systems are especially useful where a relatively large number of objects or types of objects need to be identified. Applicant's U.S. Pat. No. 4,475,481 is an example of such a transponder/transceiver electronic identification system.

Further, because the incoming interrogation signal and the outgoing responsive signal are typically RF signals that have been transmitted from an appropriate RF transmitter circuit, and because such signals can generally be transmitted over further distances than the interactive magnetic field distances associated with detuned/tuned systems, the transponder type identification system is more adaptable to applications where the objects to be identified and the controller/interrogator unit are not necessary in close proximity to each other. (In this application, the term "transponder" will hereinafter be used to mean either "transponder" or "transceiver".)

Unfortunately, because RF transmitter and receiver circuits, as well as encoding and modulation circuits, must be employed within the identification element of a transponder type system, such elements must either carry their own independent power source (e.g., a battery) or must include additional circuitry that allows the needed operating power to be derived from the incoming RF signal. These additional power and circuit requirements have not heretofore allowed the transponder identification element of a transponder type identification system to be realized as inexpensively and compactly as would be desired for many identification applications.

What is needed, therefore, is a transponder type identification element that can be realized inexpensively and compactly in a very small space, thereby providing a transponder type identification system that includes all the advantages of similar prior art transponder type systems, but which eliminates the disadvantages thereof. The present invention addresses this and other needs.

SUMMARY OF THE INVENTION

In accordance with the teachings of the present invention, a very small, inexpensive, reliable transponder device may be realized on a single monolithic semiconductor chip. This chip, in turn, may be incorporated into a very small lightweight tag or label that can be readily and unobtrusively affixed to or carried by movable or ambulatory objects that are to be identified. Such tags or labels may thus function as the identification element of a transponder type identification system as described above.

Advantageously, because the transponder device of the present invention may be realized on a single semiconductor chip, the entire transponder identification element may be packaged in a housing that is much smaller than any similar elements heretofore available. Thus much smaller size opens the door to electronic identification applications not previously possible. For example, in accordance with one embodiment of the invention, the entire transponder device, including its receiving and transmitting antenna coil and power circuits, may be realized on a single semiconductor chip. The small size of a semiconductor chip allows it to be affixed to very small articles, such as vials in a chemical or pharmaceutical processing plant, the location, batch, date code, etc., of any individual vial of which can thereafter be electronically monitored.

The transponder device of the present invention includes receiving means for receiving a carrier signal from a controller/interrogator signal; and diode means for: (1) rectifying the received carrier signal in order to generate the operating power for the device, and (2) mixing an encoded data word (used to identify the particular transponder device being interrogated) with the carrier signal. Also included within the circuits of the transponder device are data generating means for deriving a clock signal that is used to extract a unique code word previously stored in a memory element of the device. This unique code word is thereafter appropriately encoded in order to generate the encoded data word that is mixed with the carrier element. The mixing of the carrier signal with the encoded data word creates sum and difference signals that are transmitted through appropriate transmitting means back to the controller/interrogator unit. Either the sum or difference signal thus serves as the responsive signal that is used to uniquely identify the particular transponder device being interrogated.

An important feature of the present invention is the use of diodes to function both as a rectifier circuit *and* as a balanced modulator circuit.

Another important feature of the invention is the ability to generate a clock signal and data word from the incoming carrier signal, thereby obviating the need for additional, bulky, power-consuming oscillator circuits and modulation/demodulation circuits. Frequency stability is maintained by using a crystal oscillator in the controller/interrogator unit to generate the carrier signal. This carrier signal, when received at the transponder device, is then divided by an appropriate integer in order to generate a stable and second carrier clock signal from which the identifying data word may be generated.

Still another important feature of the invention is the ability to realize all of the transponder circuits on a single monolithic semiconductor chip. In one embodiment, even the receiving/transmitting antenna coil is placed around the periphery of the chip, thereby providing a complete, self-contained, single chip transponder device.

The above and other features combine to provide a transponder device that is vastly improved over any prior art devices. For example, because the circuits can be realized on a single semiconductor chip, the transponder function can be realized for a significantly lower cost. Further, because only a single chip is involved, fewer components are needed to complete the identification system assembly, again resulting in reduced cost and significantly enhancing the system's reliability.

Alternative embodiments of the invention contemplate the use of various hybrid elements to complement and enhance the circuits of the single monolithic semiconductor chip. For example, the addition of a hybrid capacitor and/or resistor allows selective tuning of the device's front end circuits to the particular data rate that is employed. Further, the addition of a hybrid crystal and associated elements allows the device to generate its own stable carrier frequency independent of the carrier frequency from which operating power is derived. Also, the addition of a hybrid battery allows the device to be converted into a self-powered beacon device that periodically transmits its identifying encoded data word without the need for the presence of a carrier signal. For applications where longer distance is required, the coil may be separate from the chip and larger than the chip in order to gather more signal strength (power) from the controller/interrogator.

An electronic identification system is realized according to the teachings of the present invention through the use of a controller/interrogator unit and a transponder device carried by each object to be identified. The controller/interrogator unit includes means for generating and transmitting a stable RF carrier signal. The controller/interrogator unit also includes means for receiving a responsive signal back from an interrogated transponder unit. The transponder unit includes the elements above described that permit it to generate the responsive signal in response to receiving the RF carrier signal, i.e., means for receiving the carrier signal, diode means for rectifying the carrier signal in order to generate operating power for the transponder unit and for mixing the carrier signal with an encoded data word in order to generate the responsive signal, clock means for generating a clock signal that is derived from the carrier signal, data generating means for generating the encoded data word in synchrony with the clock signal, and means for transmitting the responsive signal back to the controller/interrogator unit.

Further, in accordance with the teachings of the present invention, a method is provided for processing a received power carrier signal in a transponder device used in an identification system. This method includes the steps of: (a) receiving the carrier signal, (b) rectifying the carrier signal in order to generate operating power for the transponder device, (c) processing the carrier signal in order to produce a clock signal and second carrier signal, (d) generating a unique data word signal using the clock signal, (e) mixing the second carrier with the power carrier signal in a balanced modulator circuit in order to generate sum and difference signals, the balanced modulator circuit being realized from the same components as are used to rectify the incoming carrier signal, and (f) transmitting the sum and difference signals. In the preferred manner of practicing this method, the clock signal is derived from the carrier signal by simply dividing the received carrier signal by an appropriate integer.

BRIEF DESCRIPTION OF THE DRAWINGS

The above features and advantages of the present invention, as well as other features and advantages, will be more apparent from the following more particular description thereof presented in conjunction with the following drawings, wherein:

FIG. 4 is a schematic diagram of the circuits of the transponder device of FIG. 1;

DETAILED DESCRIPTION OF THE INVENTION

The following description is of the best presently contemplated mode of carrying out the invention. This description is not to be taken in a limiting sense but is made for the purpose of describing the general principles of the invention. The scope of the invention should be determined with reference to the appended claims.

Figure 1:
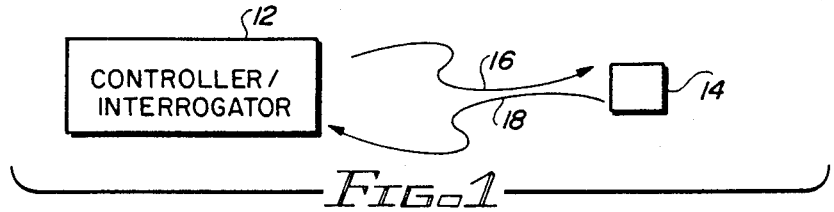
FIG. 1 is a block diagram of an identification system, and illustrates the interaction between a controller/interrogator unit and a transponder device.

Referring to FIG. 1 there is shown a simplified block diagram of an identification system. The system includes a controller/interrogator unit 12 and a plurality of transponder devices or units 14, only one of which is shown in FIG. 1. Each object to be identified carrier a transponder an interrogation signal 16 that is received by the transponder unit 14. After receiving and processing the interrogation signal 16, the transponder 14 transmits a response signal 18 back to the controller/interrogator 12. This response signal 18 has encoded therein an identifying data word that is unique to the particular transponder unit 14 from which is originated. Hence, by positioning or placing the transponder units 14 on the objects to be identified, it is possible to electronically identify the people, animals, or other objects being identified.

Figure 2:
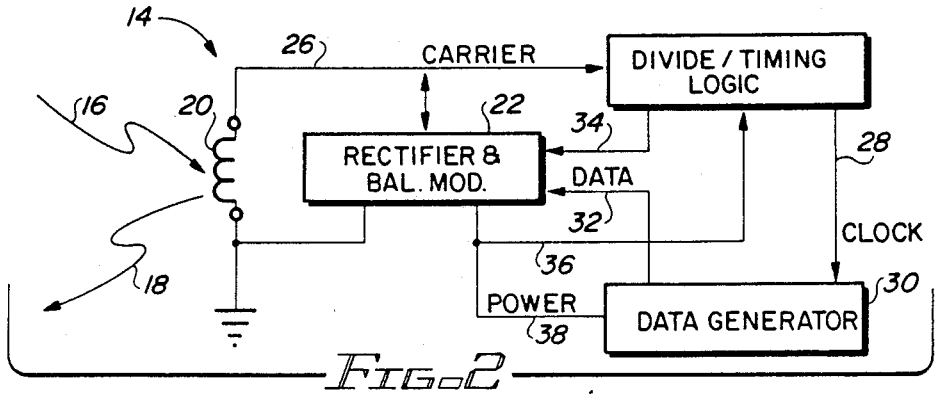
FIG. 2 is a block diagram of the transponder device of FIG. 1.

Referring next to FIG. 2, a block diagram of the transponder unit 14 is shown. The interrogation signal 16 is received by an antenna coil 20. In the preferred embodiment, this interrogation signal is simply an RF carrier signal that is applied to rectifier/balanced modulator circuit 22 and divide/timing logic circuit 24 over signal line 26. Divide/timing logic circuit 24 divides the carrier signal by an appropriate integer n in order to generate a clock signal and second carrier signal, on output signal line 28, having a frequency that is 1/nth of the frequency of the incoming carrier signal. The clock signal drives data generator circuit 30, which circuit generates an encoded data word. This encoded data word is presented over signal line 32 to the rectifier/balanced modulator 22. Also presented to the rectifier/balanced modulator 22, over signal line 34, is a buffered carrier signal. This buffered carrier signal can be either a "squared-up" version of the incoming carrier signal 16, or a modified carrier signal that has a frequency $\frac{1}{2}$ or $\frac{1}{4}$ of the incoming carrier signal 16. The modified or buffered carrier signal and the encoded data word are mixed in the rectifier/balanced modulator 22 in order to produce sum and difference signals. These signals appear on signal line 26 and are presented to antenna coil 20, from which they are transmitted as the responsive signal 18.

The incoming carrier signal 16 is also rectified by the rectifier/balanced modulator circuit 22 in order to generate the operating power used by the divide/timing logic 24 and the data generator 30. This operating power is distributed to these circuits over power lines 36 and 38, respectively.

Figure 3:
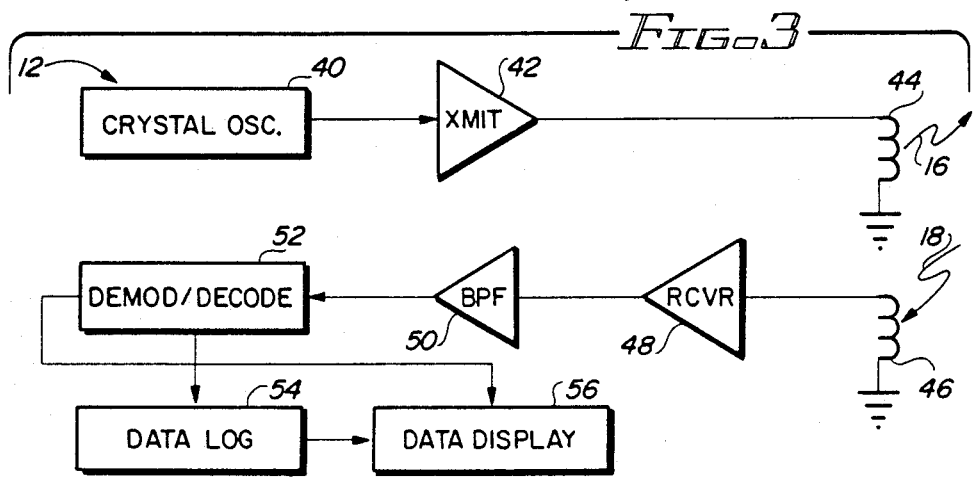
FIG. 3 is a block diagram of the controller/interrogator unit of FIG. 1.

In FIG. 3, a block diagram of the controller/interrogator unit 12 is depicted. While the present invention is primarily directed to the transponder unit 14, and not to the controller/interrogator 12, some features of the controller/interrogator 12 enhance the operation of the transponder unit 14. For example, in the preferred embodiment, the carrier or interrogation signal 16 is generated using a crystal oscillator 40 and appropriate transmission circuitry 42, including transmission antenna or coil 44. This action causes the carrier signal 16 to have a very stable frequency. Because of this stable frequency, it is not necessary, in the preferred approach, to incorporate another crystal oscillator in the transponder unit 14.

The responsive signal 18 generated by the transponder unit 14 is received at the controller/interrogator 12 through antenna coil 46 and receiver circuit 48. These components are tuned to the particular frequency expected for this signal, which, as explained above in conjunction with FIG. 2, will be either the sum or difference frequency resulting from mixing the encoded data word signal with the carrier signal. Further, a band pass filter circuit 50 (which may be included within the receiver circuit 48) will further assure that only those frequencies of interest are passed on to the demodulation/decode circuits 52. At the demodulation/decode circuits 52, the responsive signal is demodulated and decoded using known demodulation and decoding techniques in order to extract the data word signal included in the responsive signal 18. This data word signal serves to identify the particular transponder unit from which it originated. It can be stored in data log circuitry 54 and subsequently displayed by data display circuitry 56. Alternatively, concurrently with the storage of the data word in data log circuitry 54, the data word may be displayed by data display circuitry 56, or data may be sent to a central processor for further processing or control.

Hence, from the block diagrams of FIGS. 1–3, it is seen that in operation the controller interrogator unit 12 generates and transmits the carrier (interrogation) signal 16. Upon receipt of this incoming carrier signal 16, the transponder unit 14 generates a second carrier signal modulated by an encoded data word that is mixed with the carrier signal in rectifier/balanced modulator 22. This action produces the responsive signal 18 that is transmitted back to the controller/interrogator 12, which responsive signal 18 uniquely identifies the transponder unit 14 from which it originated.

A schematic diagram showing all usable signals brought out to the pins or transponder unit 14 is illustrated in FIG. 4. This diagram depicts all of the circuits that are included on the single monolithic semiconductor chip, and further shows the nine pins of terminals, labeled 1–9, that are used to interface with these circuits. While the antenna coil 20 is not included in the diagram of FIG. 4, it is noted that it too can be included on the semiconductor chip as shown in FIG. 9.

Still referring to FIG. 4, it is seen that the circuitry is relatively simple and that not a lot of circuit elements are required. This simplicity, unavailable heretofore in similar transponder devices, makes possible the incorporation of the device as a self-contained unit on a single chip.

Figure 5A:
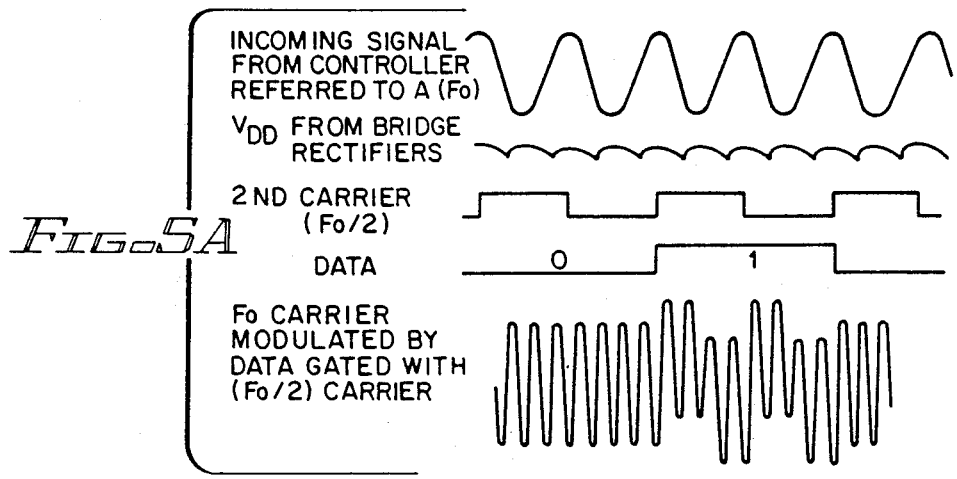
FIG. 5A illustrates some of the signal waveforms associated with the operation of the circuit of FIG. 5.
Figure 5:
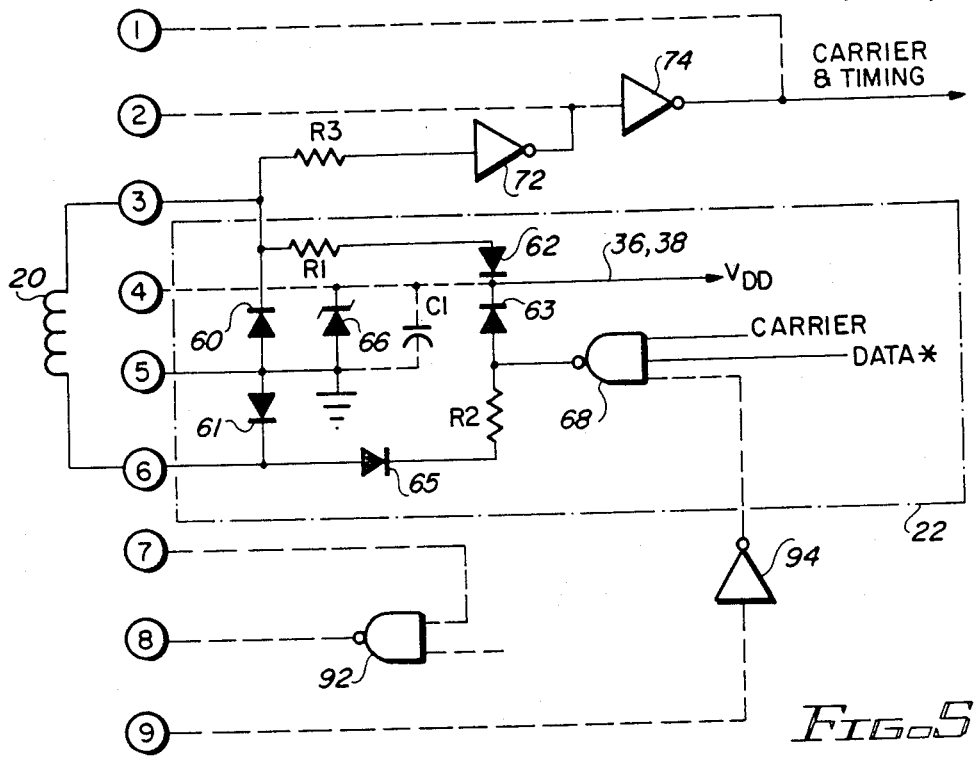
FIG. 5 is a schematic diagram of the front end of the transponder device of FIG. 1, and illustrates the diode bridge circuit that functions as a rectifier circuit and a balanced modulator circuit.

Referring next to FIG. 5, the front end of the circuits of FIG. 4—principally the rectifier/balanced modulator circuits 22—will be explained. From FIG. 5 it is seen that the rectifier/balanced modulator 22 is realized with a diode bridge comprising diodes 60, 61, 62, and 63. The input terminals to this bridge circuit are pins 3 and 6. An additional diode 65 is inserted between and in series with diodes 61 and 63. This diode 65 allows the modulated signal, when applied to the rectifier/balanced modulator 22, to swing more and thereby increase the percentage of modulation. Further resistors R1 and R2 are inserted into the legs of the bridge circuit as shown in order to distribute the current flow in an appropriate manner. In this regard, resistor R3 also serves to proportion the amount of signal current delivered to the divide/timing logic 24 through pin 3. In the preferred configuration, R1 has a value that is about 1/10th the value of R2, and R2 has a value that is about 1/10th the value of R3. Hence, in operation, most of the signal current delivered through pin 3, e.g., during a positive half cycle of the carrier signal, passes to the divide/timing logic 24 and not to the bridge circuit portion that includes diode 62. However, when pin 6 is positive with respect to pin 3, e.g., during a negative half cycle of the carrier cycle, then most of the signal current passes through diodes 65 and 63 in order to charge the supply voltage.

A zener diode 66 is incorporated into the bridge circuit in order to stabilize the voltage VDD that is generated. In the preferred embodiment, the voltage VDD is around six volts, although any suitable voltage level could be used. The bridge circuit uses the capacitance inherent in all the circuit elements present on the chip to help store the energy needed to maintain a sufficiently constant supply voltage VDD. This capacitance is shown in FIG. 4, as C1, but it is to be understood that C1 represents all of the distributed and other internal capacitance present on the chip, and is not a separate element. In this regard, the inventor has found that it is not necessary that the voltage supply VDD be maintained at a constant level at all times. It is sufficient, for the type of synchronous operation herein used, if the supply voltage VDD is maintained at a prescribed level only when the circuits are active (i.e., drawing current). For CMOS circuits, such activity only exists during a data transition. Because the operation of the device is essentially synchronous—everything occurs in synchrony with the clock signal, which in turn is in synchrony with the received carrier signal—it is possible for the device to function so long as the requisite VDD voltage is present during the transitions of the carrier signal. Where the frequency of the carrier signal is sufficiently fast, as is the case here, the capacitance C1 doesn't have to hold a charge very long in order for the device to operate. Hence, C1 (which, again, is comprised of all the distributed and internal capacitance on the chip) does not have to be very large in order for the device to operate. It is noted, for example, that the static current drain of a typical CMOS chip is the picoamp range.

Further, even when semiconductor devices other than CMOS circuits are employed, such as TTL or GaAs devices, it is possible for the circuit to function during only a selected half cycle of the carrier signal by setting up the logic circuits so that they only change states during this selected half cycle. Thus, it is possible to design the VDD generation circuitry so that it is primarily charging up during, for example, the negative half cycle of the carrier signal, and design the logic circuits so that they are not active until the positive half cycle of the carrier signal, at which time sufficient charge will be available to provide the needed operating power.

FIG. 5A illustrates some of the foregoing principles of operation relative to the circuit of FIG. 4 and 5. In FIG. 5A, the incoming carrier signal 16 from the controller/interrogator 12 is shown having a frequency Fo. After full-wave rectification, this signal substantially as a dc level having a ripple frequency of 2Fo. A second carrier signal is obtained by dividing the incoming carrier signal by two. This second carrier signal therefore has a frequency of Fo/2. This second carrier signal can, for desired embodiments, be used as a clock signal to generate a data signal, two bits of which, "01", are shown in FIG. 5A. In turn, this data signal, gated with the second carrier signal Fo/2, is used to modulate the Fo carrier signal, realizing a modulated signal as shown at the bottom of FIG. 5A.

Also included as part of the rectifier/balanced modulator circuit 22 of FIGS. 4 and 5 is NAND gate 68. This gate 68 serves to combine the carrier signal (or a derivative of the carrier signal), on signal line 34, with the encoded data, on signal line 32, and apply this combination to the diodes 60–63 of the bridge circuit. This action causes these signals to be mixed, resulting in sum and difference frequencies that are presented to the output pins 3 and 6 (and hence to the antenna coil 20)

for transmission to the controller/interrogator 12 or other receiving device.

It is noted that gate 68 of the rectifier/balanced modulator 22 also has a control signal line 70 applied thereto, the function of which is explained below in conjunction with the discussion of FIG. 8.

Referring next to the divide/timing logic portion 24 of FIG. 4, it is seen that the incoming carrier signal (received through pin 3) passes through resistor R3 and inverter gates 72 and 74. The output of gate 72 is made available at pin 2, and the output of gate 74 is made available at pin 1. These pins can be used as explained below in connection with the discussion of FIGS. 6 and 7.

The output of gate 74 is presented to the clock input of a register 76. This register 76 divides the carrier signal by an appropriate factor. While the embodiment shown uses a simple series divide-by-2 arrangement, thereby providing outputs that have been divided by 2, 4, 8, 16, . . . , the invention contemplates that other dividing schemes could be employed such that the carrier signal could be divided by any desired integer n.

The desired division of the carrier signal in register 76 provides a clock signal that has a frequency that is 1/nth of the carrier frequency. Included in the divide/timing logic 24 are selection gates 78 that allow the selection of different clock frequencies as controlled by a control signal applied to pin 9. The selected clock signal is then presented to the data generator circuitry 30 over signal line 28.

Data generator circuitry 30 includes a programmable read only memory (PROM) array 80 which is accessed through suitable memory control logic elements 82-85. Elements 82 and 84 are registers through which the clock signal cycles. After a prescribed number of clock cycles, these registers address certain rows and columns of the memory array 80 in order to extract the data that has been previously programmed therein. This data is passed serially to gate 86, as is the signal Q4 from register 84. As long as Q4 is high, the extracted data word is allowed to pass out of gate 86, over signal line 88, to Manchester encoder circuit 90. Manchester encoder circuit 90 encodes the data word according to well known Manchester encoding techniques and presents the encoded data word to the rectifier/balanced modulator circuit 22 over signal line 32. In the preferred embodiment, the encoded word is 64 bits long, although any suitable bit length could be employed. Further, encoding schemes other than a Manchester encoding scheme could also be employed.

The PROM memory array 80 may be realized using any suitable PROM configuration that can readily be incorporated on the same semiconductor chip as are the other transponder circuits. Preferably, an EEPROM (Erasable Electrically Programmable Read Only Memory) device could be used. Advantageously, during manufacture of the chip, or thereafter, the PROM can be easily programmed to contain an appropriate data word that would serve to uniquely identify that particular device. For example, a manufacturing date code in combination with a serial number could be employed for this purpose. If the identifying data word programmed into the device during manufacture did not suit the particular application, this data word could subsequently be erased using appropriate equipment and a new, more suitable, data word could be programmed thereinto.

Also shown in FIG. 4 is a NAND gate 92 and an inverter gate 94. The inverter gate 94 is connected to pin 9 and is used to condition a control signal applied to pin 9 as discussed below in conjunction with FIG. 8. The NAND gate 92 has one input connected to pin 7 and the other input connected to the data word signal output from the memory array 80 through gate 86. The output of this NAND gate 92 is connected to pin 8. This gate 92 can be selectively connected to additional hybrid elements as discussed below in connection with FIG. 8 in order to provide additional options for using the transponder device.

Figure 6:
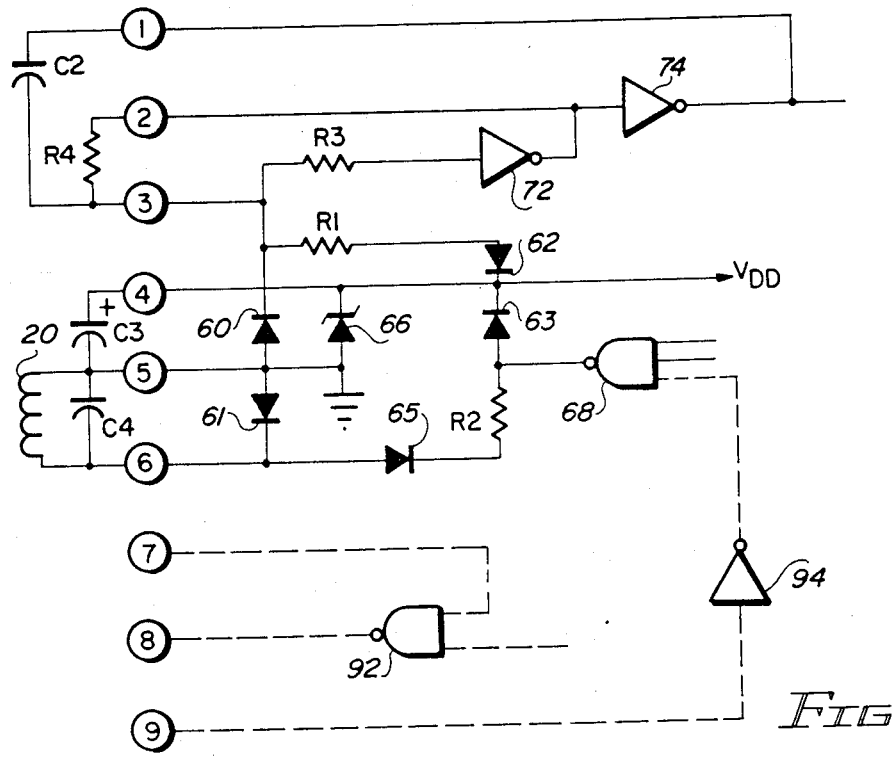
FIG. 6 is a schematic diagram of the front end of the transponder device of FIG. 1, and illustrates the use of additional hybrid components that can be connected to the transponder device in order to provide selective tuning of the carrier receiving circuits.
Figure 7:
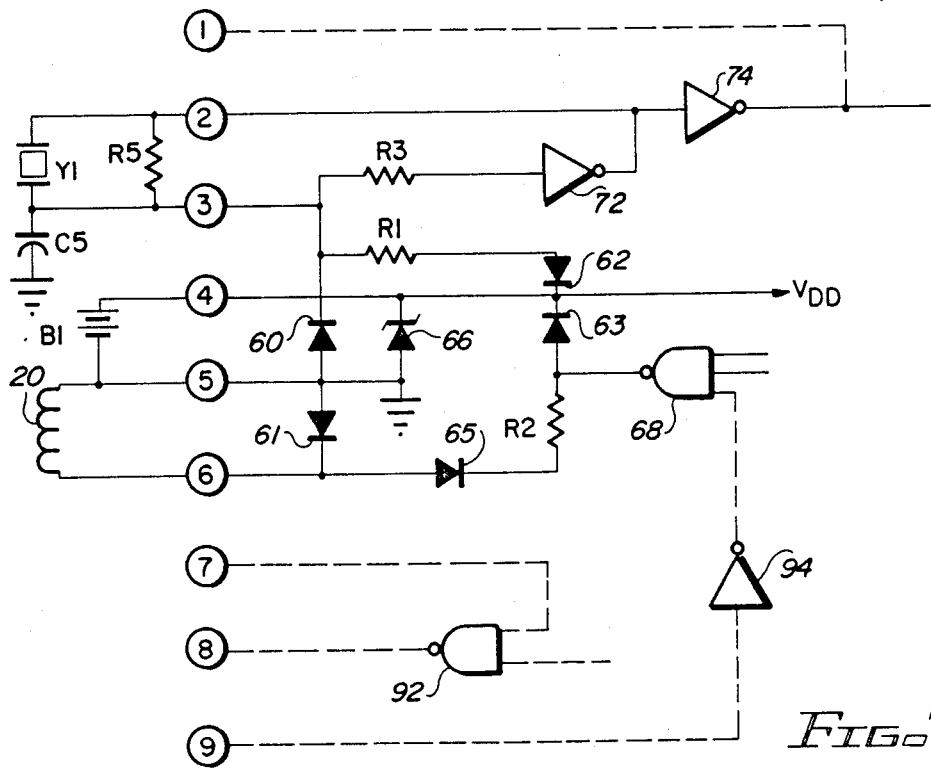
FIG. 7 is a schematic diagram of the front end of the transponder device of FIG. 1, and illustrates the use of a hybrid crystal and battery connected thereto in order to provide additional flexibility in its operation.
Figure 8:
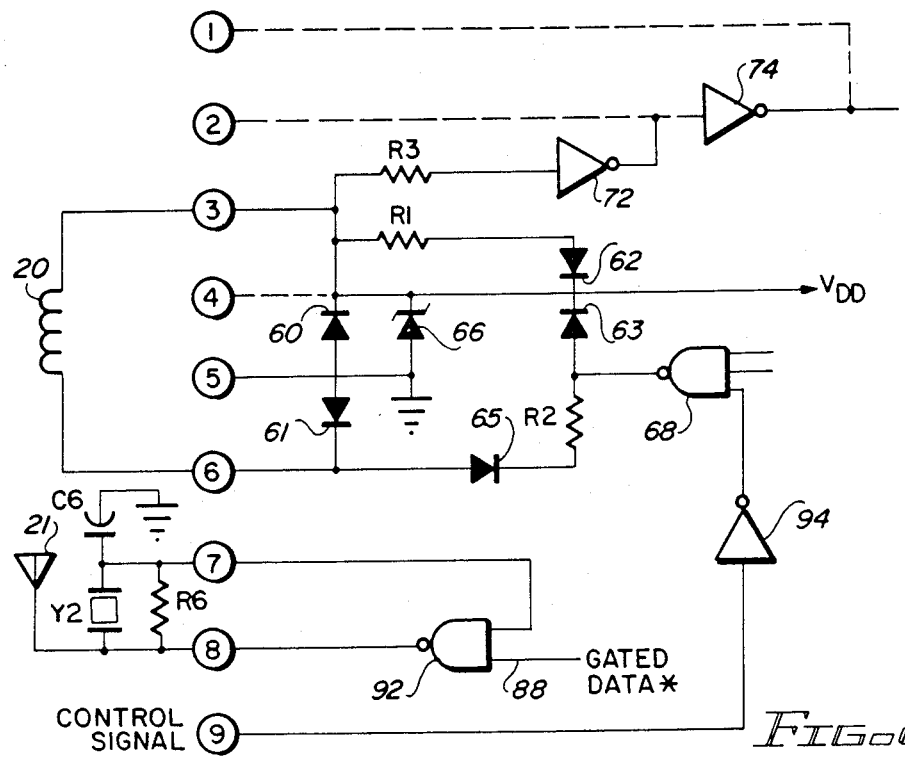
FIG. 8 is a schematic diagram of the front end of the transponder device of FIG. 1, and illustrates the use of still additional hybrid elements connected thereto in order to provide selective gating with a crystal oscillator to limit data at a high frequency unrelated to the power carrier frequency.

Referring next to FIGS. 6-8, schematic diagrams of the front end circuits of the transponder unit 14 are shown, as in FIG. 5, but further including additional hybrid elements connected thereto through the pin connections provided. In FIG. 6, capacitor C2 is connected between pins 1 and 3, and resistor R4 is connected between pins 2 and 3. Further, hybrid capacitors C3 and C4 are connected in tandem as shown between pins 4 and 5, and pins 5 and 6, respectively. Also, in FIG. 6, the antenna coil 20 is connected between ground, pin 5, and pin 6, in order to disassociate it from interacting with R4 and C2. The values of capacitors C3 and C4 are selected as required in order to tune the front end circuit to the particular carrier frequency that is employed. The values of R4 and C2 are selected as needed in order to adjust the bit timing. Thus, flexibility is provided in order to make minor adjustments, i.e., tune the circuit, for the particular carrier frequency that is used.

In FIG. 7, the single chip transponder unit 14 of the present invention is converted to a more conventional transponder unit through the use of a hybrid crystal oscillator circuit, comprising crystal Y1, capacitor C5, and resistor R5, and a battery B1. The crystal Y1 and resistor R5 are connected across pins 2 and 3, while capacitor C5 is shunted from pin 3 to ground (pin 5). This configuration results in an oscillator circuit comprising the inverter gate 72, resistors R3 and R5, crystal Y1, and capacitor C5. This oscillator circuit allows the data word to be generated totally independent of the frequency of any incoming carrier signal. Further, when a battery B1 is employed, as shown, the transponder device is no longer dependent on the carrier signal, and therefore becomes a transmitting circuit that continually transmits its identifying signal. When a battery B1 is employed in this fashion, it will typically have a voltage level output that is slightly less than that of zener diode 66, thereby keeping zener diode 66 turned off and effectively out of the circuit.

In FIG. 8, a hybrid crystal Y2, capacitor C6 and resistor R6 are connected as shown to pins 7 and 8 in order to create a crystal oscillator circuit that selectively transmits the data word through a separate antenna 21. The crystal oscillator is realized with internal-to-the-chip gate 92 and Y2, C6, and R6. Antenna coil 20 still receives a carrier signal and generates VDD therefrom. Further, the frequency of the carrier signal determines the clock rate, which in turn determines the rate at which the data word, appearing on signal line 88, appears. The crystal oscillator output signal, presented to antenna 21, is effectively modulated with the data word appearing on signal line 88. Because gate 92 is only active when VDD is present, the circuit of FIG. 8 can thus function as a responding unit that transmits the data word on a carrier frequency independent of the incoming carrier signal. The use of a control signal applied to pin 9 further disables any signal from being mixed in the rectifier/balance modulator circuit 22, and hence from being transmitted through antenna 20, during the time that a signal is being transmitted from antenna 21. Such a control signal can simply be realized by hardwiring pin 9 to a desired potential.

It is noted that the circuits of FIGS. 6–8 represent only a portion of the various circuit configurations and options that could be realized using the single chip transponder device of the present invention.

Figure 9A:
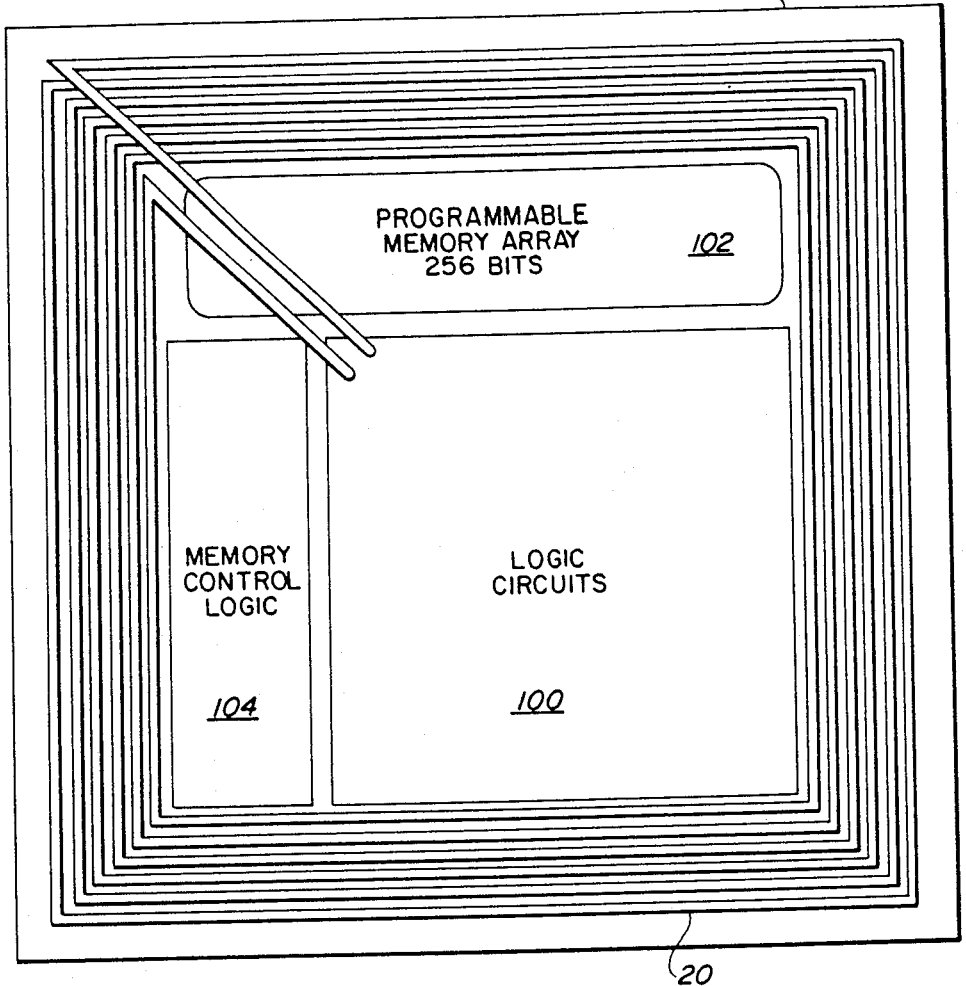
FIG. 9A is a top view of a monolithic semiconductor chip showing a generalized topographical layout of the various types of circuits used within the transponder device.

FIG. 9A shows a topographical representation of the transponder chip 14 in an embodiment that includes the antenna coil 20 as part of the monolithic chip. In accordance with this embodiment, the coil 20 is etched or otherwise placed around the periphery of the chip substrate 98, as described below. In the center of the coil 20 are found a custom logic circuit 100, a programmable memory array 102, and memory control logic 104. Programmable memory array 102, which may be realized for example from an EEPROM device, comprises the memory array 80 depicted in FIG. 4. Memory control logic 104 comprises the memory control elements 82–85 of FIG. 4, and the custom logic circuit 100 includes the balance of the circuitry shown in FIG. 4. Thus, using the chip topography shown in FIG. 9A, a functionally complete transponder unit 14 is realized on a single semiconductor chip.

Still with reference to FIG. 9A, it is noted that placement of the logic circuit 100, memory array 102, and memory control logic 104 on the chip substrate 98 can be readily accomplished by those skilled in the art using known hybrid or monolithic circuit fabrication techniques. Not so readily known in the art, is the manner in which the antenna coil 20 is placed on the chip substrate 98.

One approach for placing the coil 20 on the chip substrate 98 is to make the coil 20 in hybrid fashion, using e.g. a copper conductor, and then bonding the wound coil 20 to the chip using conventional bonding techniques. This approach would advantageously allow the coils to be effectively stacked, if needed, in order to increase the coil inductance without adding stray capacitance.

Figure 9B:
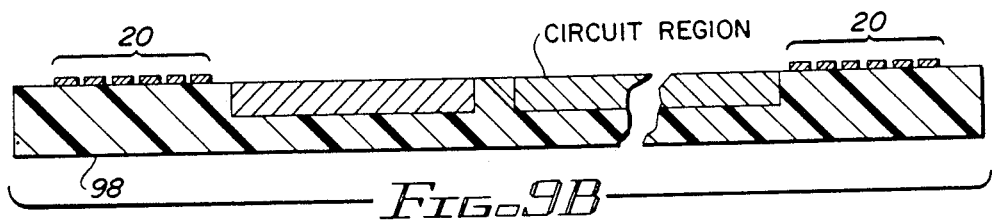
FIG. 9B is a cross-sectional view of the chip of FIG. 9A.

The preferred approach for placing the coil 20 on the chip substrate 98, however, is to use a deposition technique that effectively creates a single monolithic chip assembly that includes all of the circuitry necessary to produce a functionally complete transponder unit 14. While, the prior art teaches that it is extremely difficult to fabricate small air core inductors of sufficiently high inductance and Q for integrated circuit applications, the suggestion is made in the prior art that the use of magnetic film cores for such inductors can reduce the number of turns required, and thereby make the fabrication of such inductors feasible. See Soohoo, "Magnetic Thin Film Inductors For Integrated Circuit Applications", IEEE Transactions in Magnetic, Vol. MAG-15, No. 6, pp. 1803–1805 (Nov. 1979). One technique for using magnetic film cores is described in Salch and Qureshi, "Permalloy Thin-Film Inductors", *Electronic Letters*, Vol. 6, No. 26, pp. 850–852 (Dec. 31, 1970). There it is stated that a 10-turn square spiral coil for use at 10 MHz can be constructed having an outer diameter of 1 cm × 1 cm. The conducting path width is 0.005 inches. The spacing between turns is 0.001 in. The copper path is deposited by vacuum evaporation and then thickness is built up to about 25 micrometers by electroplating. Two permalloy magnetic films, having a thickness of from 1000–3000 Angstroms, surround the conductors, one on top, and the other on the bottom. The film is evaporated in an orienting magnetic field in such a way that the long dimension is parallel to the field, and thus it is the easy direction of magnetisation of the film. When a high-frequency current passes in the coil, the magnetic films are driven in a hard direction, and the two magnetic films around each conductor act as a magnetic core enclosing a 1-turn coil. The effect of the magnetic films is to increase the inductance of the coil in addition to its free-space inductance. The magnetic permeability is quite large, since the films are driven in the hard direction. Further, an insulting silicon-monoxide layer (SiO, 10,000 A thick) separates each magnetic film from the conducting path. For purposes of the present invention, the technique used to place the coil 20 on the substrate 98 is as follows:

(a) a wafer of semiconductor substrate material is processed, using conventional methods and technology, to place the IC circuits in the center of each desired chip area, as shown in FIGS. 9A and 9B;

(b) a conductive trace 110 is deposited on the substrate between the regions 112, 114 (optionally, this step may be included in the fabrication of the circuit of step (a));

(c) a permalloy magnetic film, or other suitable material having a large magnetic permeability and electrical insulating properties, is applied over the wafer, leaving holes for contact to the return trace and the logic circuits at 106, 108, 112 and 114.

(d) the coil 20, with the exception of the trace 110 (which was previously deposited), is deposited and lithographed using conventional techniques, (e) contacts are made to the logic circuit 100 through the holes 108, 106, and to the trace 110 through holes 112 and 114;

(f) a second permalloy magnetic film, or other suitable material having desired properties, is applied over the wafer;

(g) the wafer is diced, thereby creating individual chips, each being a fully functional transponder device.

It is noted that the application of the magnetic film, in steps (c) and (f) involves appropriate evaporation (or equivalent techniques) in order to control the thickness thereof, which evaporation may occur in the presence of an orienting magnetic field, as previously described. Thus, this step may involve two sub-steps, a first to place and magnetically orient the magnetic film in a first direction; and a second to place and magnetically orient the film in a second direction (orthogonal to the first direction).

While the invention herein disclosed has been described by means of specific embodiments and applications thereof, numerous modifications and variations could be made thereto by those skilled in the art without departing from the spirit and scope of the present invention. It is to be understood therefore that within the scope of the appended claims, the invention may be practiced otherwise than as specifically described herein.

What is claimed is:

1. A transponder device comprising:
a single monolithic semiconductor chip;
receiving means for receiving a carrier signal from an external source;
diode means for rectifying the received carrier signal in order to generate operating power for the transponder device, and for mixing an encoded data word with the carrier signal in order to generate sum and difference signals;

digital circuit means for deriving a clock signal from said carrier signal;

data generating means responsive to said clock signal for generating the encoded data word that is mixed with the carrier signal in said diode means; and transmitting means for transmitting the sum and difference signals to a location external from said transponder device;

said diode means, digital circuit means, and data generating means comprising electrical circuits that are realized on said single monolithic semiconductor chip.

2. The transponder device of claim 1 further including a plurality of select hybrid circuit elements and means for connecting said hybrid circuit elements to the electrical circuits of said monolithic semiconductor chip in order to tune said electrical circuits to the frequency of said carrier signal.

3. The transponder device of claim 1 further including a hybrid battery and means for connecting said hybrid battery to the electrical circuits of said monolithic semiconductor chip in order to provide operating power therefor independent of any power contained within said carrier signal.

4. The transponder device of claim 1 further including a hybrid crystal element and means for connecting said hybrid crystal element to the electrical circuits of said monolithic semiconductor chip in order to provide crystal frequency control of the signals used within said electrical circuits independent of the frequency of said carrier signal.

5. The transponder device of claim 1 wherein the receiving means and transmitting means comprise a single antenna coil that is placed around the periphery of the single monolithic semiconductor chip.

6. The transponder device of claim 5 wherein said monolithic semiconductor chip is no larger than 0.01 square inches.

7. The transponder device of claim 1 wherein said diode means comprises a bridge circuit that functions both as a rectifier circuit and a balanced modulator circuit.

8. The transponder device of claim 1 wherein said data generating means includes programmable read only memory (PROM) means, said PROM means having a unique code word previously programmed therein from which said encoded data word is derived.

9. The transponder device of claim 8 wherein said data generating means includes encoding means for encoding the unique code word programmed in said PROM means.

10. The transponder device of claim 9 wherein said encoded data word generated by the encoding means of said data generating means comprises an n bit digital word, wherein n is an integer greater than 7.

11. An electronic identification system for identifying a plurality of objects comprising:

a controller/interrogator unit for interrogating the objects to be identified and processing the responses received, said controller interrogator unit including:

means for generating an RF carrier signal, said RF carrier signal comprising an interrogation signal, means for transmitting said interrogation signal towards an object to be identified, means for receiving a responsive signal generated in response to said interrogation signal, and means for decoding, storing, and displaying the response received; and a transponder unit, carried by each object to be identified, comprising:

a single monolithic semiconductor chip;

receiving means on said semiconductor chip for receiving the interrogation signal from said controller-interrogator unit, diode means on said semiconductor chip for rectifying the received interrogation signal in order to generate operating power for the transponder device, and for mixing an encoded data word with a digital carrier signal in order to generate sum and difference signals, said sum and difference signals comprising said responsive signal, digital circuit means on said semiconductor chip for deriving a clock signal and said digital carrier signal from said interrogation signal, data generating means on said semiconductor chip responsive to said clock signal for generating the encoded data word that is mixed with the digital carrier signal in said diode means, and transmitting means on said semiconductor chip for transmitting the responsive signal to said controller/interrogator unit.

12. The identification system of claim 11 wherein the receiving means and transmitting means of said transponder unit include a single antenna coil that is placed around the periphery of said single monolithic semiconductor chip.

13. A transponder device consisting of:

a single semiconductor chip;

receiving means placed on said semiconductor chip for receiving a carrier signal from an external source;

diode means for rectifying the received carrier signal in order to generate operating power for the transponder device, and for mixing an encoded data word with the carrier signal in order to generate sum and difference signals, said diode means comprising an electrical circuit that is fabricated on said semiconductor chip;

digital circuit means for deriving a clock signal from said carrier signal, said digital circuit means comprising electrical circuits that are fabricated on said semiconductor chip;

data generating means responsive to said clock signal for generating the encoded data word that is mixed with the carrier signal in said diode means, said data generating means comprising an electrical circuit that is fabricated on said semiconductor chip; and transmitting means placed on said semiconductor chip for transmitting the sum and difference signals to a location external from said transponder device.

14. The transponder device of claim 13 wherein the receiving means and transmitting means include an antenna coil that is deposited around the periphery of the single monolithic semiconductor chip.

* * * * *